United States Patent [19]

Itou

[11] Patent Number: 5,956,278
[45] Date of Patent: Sep. 21, 1999

[54] SEMICONDUCTOR CIRCUIT DEVICE WITH INTERNAL POWER SUPPLY CIRCUIT

[75] Inventor: Takashi Itou, Hyogo, Japan

[73] Assignee: Mitsubishi Denki Kabushiki Kaisha, Tokyo, Japan

[21] Appl. No.: 08/856,445

[22] Filed: May 14, 1997

[30] Foreign Application Priority Data

Nov. 18, 1996 [JP] Japan .................................. 8-306542

[51] Int. Cl.[6] ...................................................... G11C 7/00
[52] U.S. Cl. .................... 365/201; 365/189.09; 365/193; 365/195; 365/225.7; 365/226
[58] Field of Search ..................................... 365/201, 226, 365/189.09, 193, 195, 225.7

[56] References Cited

U.S. PATENT DOCUMENTS

| 5,249,155 | 9/1993 | Arimoto et al. ................. 365/222 |
| 5,612,920 | 3/1997 | Tomishima ...................... 365/226 |
| 5,644,250 | 7/1997 | Ooishi .......................... 365/201 X |

FOREIGN PATENT DOCUMENTS 7-211869  8/1995  Japan .

*Primary Examiner*—Do Hyun Yoo
*Attorney, Agent, or Firm*—McDermott, Will & Emery

[57] ABSTRACT

In a DRAM (Dynamic Random Access Memory) having a voltage down converter, a driver transistor in the voltage down converter is connected parallel to another driver transistor, thus the driver transistor is selectively inactivated in response to a test mode signal TE which is activated by detection of WCBR and an address key. Therefore, an optimal gate width of driver transistors can be easily evaluated when the voltage down converter oscillates.

13 Claims, 10 Drawing Sheets

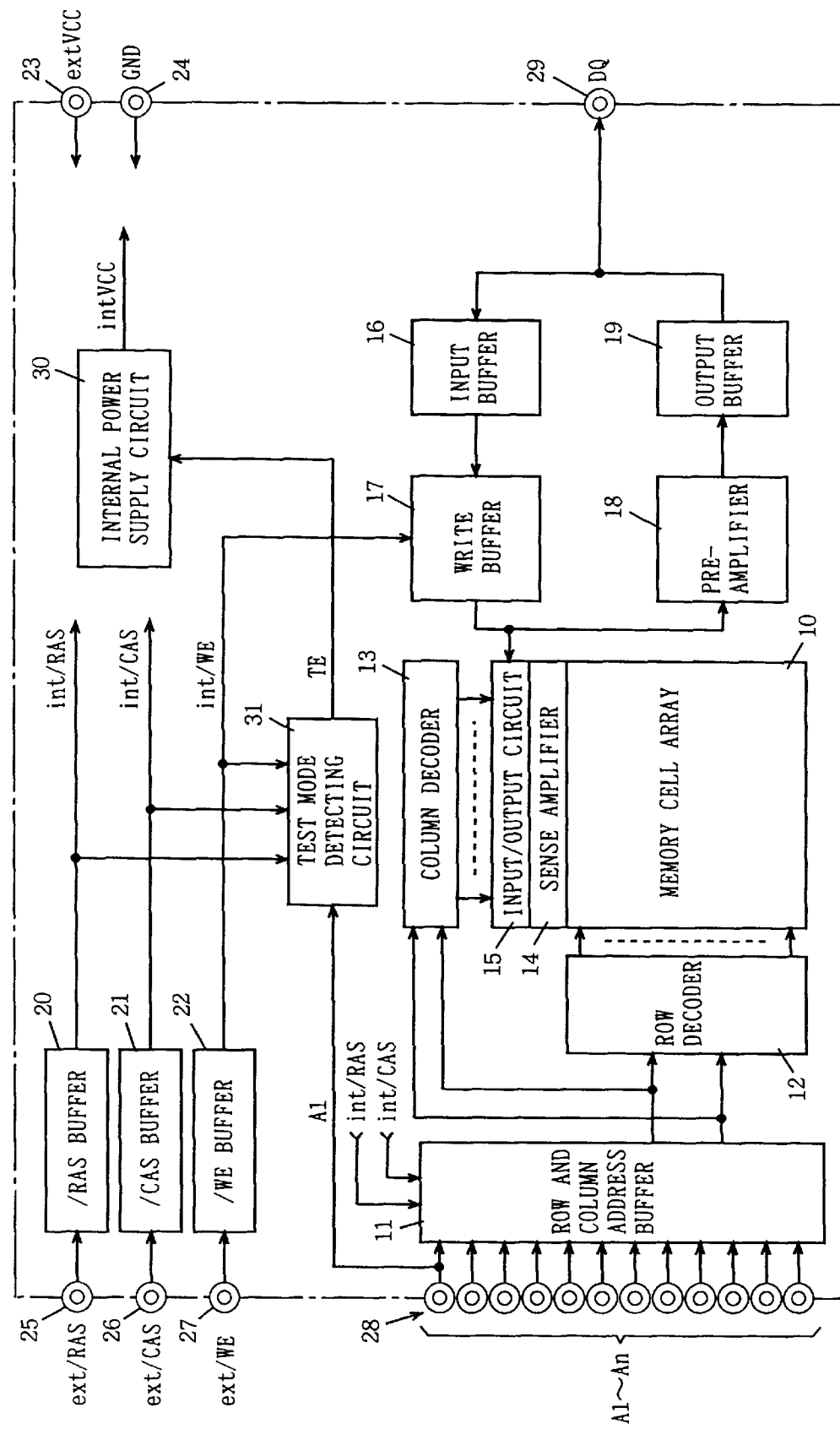
F I G. 1

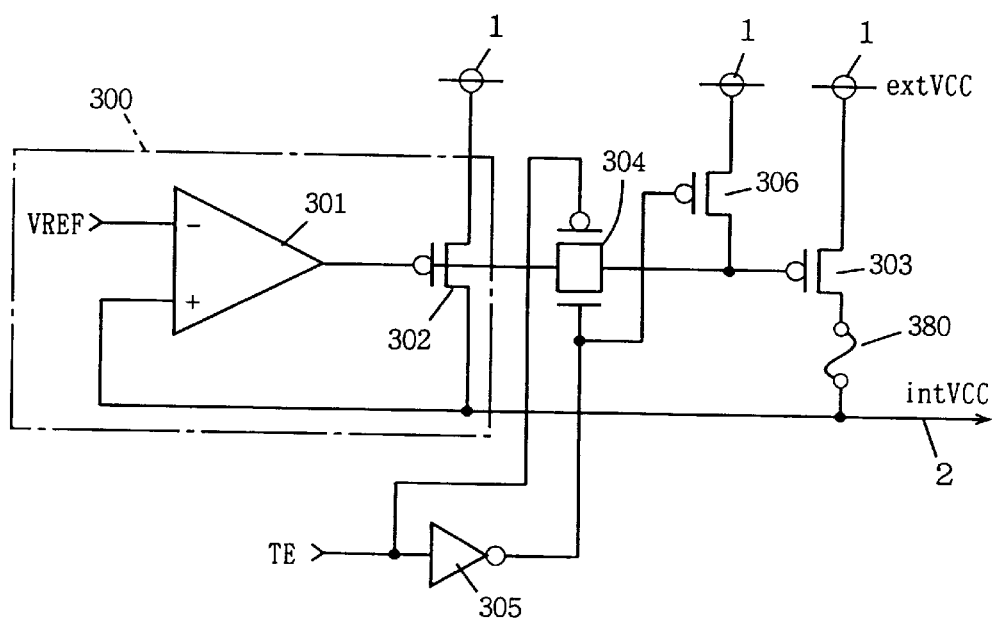

SEMICONDUCTOR CIRCUIT DEVICE WITH INTERNAL POWER SUPPLY CIRCUIT

BACKGROUND OF THE INVENTION

1. Field of the Invention

The present invention relates to a semiconductor circuit device and more particularly to a semiconductor circuit device receiving an external power supply voltage and having normal and test modes.

2. Description of the Background Art

A semiconductor memory device such as a DRAM (Dynamic Random Access Memory) or an SRAM (Static Random Access Memory) is currently provided as a semiconductor circuit device. Recently, a semiconductor memory device having an internal power supply circuit which generates an internal power supply voltage (3.3V, for example) by lowering an external power supply voltage (5V, for example) has been also provided to reduce power consumption.

FIG. 14 is a circuit diagram showing a structure of a conventional internal power supply circuit used, for example, in a DRAM. Referring to FIG. 14, the conventional internal power supply circuit includes a differential amplifier 3 and a driver transistor 4. Differential amplifier 3 has an inverted input terminal receiving a reference voltage VREF and a non-inverted input terminal connected to an internal power supply node 2. Driver transistor 4 has its gate connected to an output terminal of differential amplifier 3, and it is connected between an external power supply node 1 and internal power supply node 2.

In the above described internal power supply circuit, the internal power supply voltage intVCC is fed back to differential amplifier 3, thus differential amplifier 3 controls driver transistor 4 so that internal power supply voltage intVCC equals to the reference voltage VREF. That is, differential amplifier 3 and driver transistor 4 form a closed loop. As a result, this internal power supply circuit supplies internal power supply node 2 with internal power supply voltage intVCC lower than the external power supply voltage extVcc.

In the above described internal power supply circuit, driver transistor 4 has desirably wider gate width to supply much current to internal power supply node 2. This is because, as shown in FIG. 15, drivability of driver transistor 4 improves as the gate width (W) becomes wider.

However, since a feedback loop is formed in the internal power supply circuit as described above, stability to oscillation degrades as driver transistor 4 has a wider gate width (W). Thus, there is a so-called trade-off between the drivability of driver transistor 4 and the stability to oscillation.

Therefore, the gate width (W) of driver transistor 4 is desirably designed to be the widest as long as oscillation is not caused. However, unexpected oscillation may occur after fabrication of a DRAM chip because it is difficult to perfectly predict an optimal gate width (W) having high drivability and improved stability to oscillation through, for example, simulation. Also, variation in a manufacturing process may cause oscillation.

When oscillation occurs after fabrication of the DRAM chip as above, the gate width (W) of a driver transistor must be redesigned to be narrower. However, it is difficult to predict how narrow a gate width (W) is sufficient to stop oscillation. Therefore, oscillation may occur again even if a new chip is fabricated by revising a mask. Thus, repetition of mask revision has been required to optimally design the gate width of driver transistor 4.

Although the FIB (Focused Ion Beam) process may evaluate the optimal gate width (W) to reduce repetition of mask revision, it is troublesome. Also, oscillation may occur inspite of the FIB process beforehand.

SUMMARY OF THE INVENTION

An object of the present invention is to provide a semiconductor circuit device which can easily optimize current supplying capability of an internal power supply circuit.

According to one aspect of the present invention, a semiconductor circuit device receiving an external power supply voltage and having normal and test modes includes an internal circuitry, a first internal power supply circuit, a second internal power supply circuit, a detecting circuit, and an activating/inactivating circuit. The internal circuitry is connected to an internal power supply node and it performs prescribed operation. The first internal power supply circuit is connected to an external power supply node receiving the external power supply voltage, and it supplies the internal power supply node with an internal power supply voltage lower than the external power supply voltage. The second internal power supply circuit is connected to the external power supply node, and it supplies the internal power supply node with the internal power supply voltage. The detecting circuit detects a test mode in response to a control signal supplied from the outside at predetermined timing, and generates a first test mode signal. The activating/inactivating circuit activates/inactivates the second internal power supply circuit in response to the first test mode signal.

Therefore, the activating/inactivating circuit activates/inactivates the second internal power supply circuit when the control signal is supplied at predetermined timing. As a result, current supplying capability of the internal power supply voltage can easily be optimized.

Preferably, the above described semiconductor circuit device further includes a plurality of address terminals receiving row and column address signals. The above described internal circuitry includes a memory cell array, an address buffer, a row decoder, a column decoder, and a writing circuit. The memory cell array has a plurality of memory cells arranged in rows and columns. The address buffer receives the row address signal in response to a row address strobe signal, and receives the column address signal in response to a column address strobe signal. The row decoder selects a row of the memory cell array in response to the row address signal from the address buffer. The column decoder selects a column of the memory cell array in response to the column address signal from the address buffer. The writing circuit writes, in response to a write enable signal, a data signal to memory cells arranged in a row selected by the row decoder and in a column selected by the column decoder. The above described detecting circuit includes a circuit for generating a second test mode signal when the column address strobe signal and the write enable signal are activated before activation of the column address strobe signal, and a circuit connected to at least one address terminal and generating a first test mode signal when the second test mode signal is activated and voltage higher than the internal power supply voltage is supplied to the at least one address terminal.

Therefore, the second internal power supply circuit is activated when the detecting circuit detects WCBR (/WE, /CAS before /RAS) and an address key. As a result, increase in chip area is suppressed as compared to a bonding option.

According to another aspect of the present invention, a semiconductor circuit device receiving an external power supply voltage and having normal and test modes includes an internal circuitry, first and second internal power supply circuits, a detecting circuit, and first and second inactivating circuits. The internal circuitry is connected to an internal power supply node and it performs prescribed operation. The first internal power supply circuit supplies the internal power supply node with an internal power supply voltage lower than the external power supply voltage. The second internal power supply circuit is connected to an external power supply node, and it supplies the internal power supply node with the internal power supply voltage. The detecting circuit detects a test mode and generates a test mode signal. The first inactivating circuit temporarily inactivates the second internal power supply circuit in response to the test mode signal. The second inactivating circuit normally inactivates the second internal power supply circuit.

Therefore, the second internal power supply circuit can be temporarily inactivated in the test mode and also normally inactivated. As a result, a semiconductor circuit device having optimized current supplying capability of the internal power supply voltage can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an overall structure of a DRAM in accordance with a first embodiment of the present invention.

FIGS. 11A to 11F are timing charts showing operation of the test mode detecting circuit of FIG. 9.

FIG. 12 is a circuit diagram showing a specific structure of an internal power supply circuit of a DRAM in accordance with a fourth embodiment of the present invention.

DESCRIPTION OF THE PREFERRED EMBODIMENTS

Figure 2:
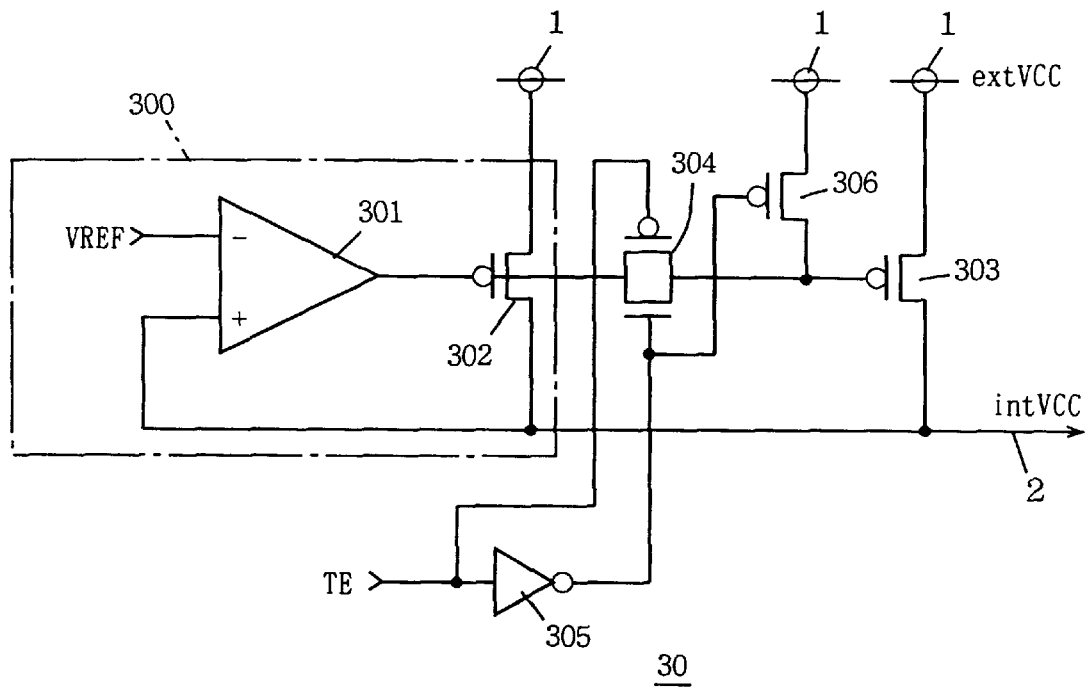
FIG. 2 is a circuit diagram showing a specific structure of n internal power supply circuit in FIG. 1.

Here, the embodiments of the present invention will be described in detail with respect to the drawings. The same or corresponding parts throughout the figures are designated by the same reference characters.

First Embodiment

FIG. 1 is a block diagram showing an overall structure of a DRAM in accordance with the first embodiment of the present invention. Referring to FIG. 1, this DRAM includes a memory cell array 10, a row and column address buffer 11, a row decoder 12, a column decoder 13, a sense amplifier 14, an input/output circuit 15, an input buffer 16, a write driver 17, a preamplifier 18, an output buffer 19, a /RAS (row address strobe signal) buffer 20, a /CAS (column address strobe signal) buffer 21, and a /WE (write enable signal) buffer 22.

This DRAM further includes a power supply terminal 23 receiving an external power supply voltage extVCC (5V, for example), a ground terminal 24 receiving a ground voltage GND, a control terminal 25 receiving an external row address strobe signal ext/RAS, a control terminal 26 receiving an external column address strobe signal ext/CAS, a control terminal 27 receiving an external write enable signal ext/WE, n address terminals 28 receiving row and column address signals A1 to An, and a data input/output terminal 29 inputting/outputting a data signal DQ.

Memory cell array 10 has a plurality of memory cells (not shown) arranged in rows and columns. Address buffer 11 receives row address signals A1 to An in response to an internal row address strobe signal int/RAS from /RAS buffer 20, and receives column address signals A1 to An in response to an internal column address strobe signal int/CAS from /CAS buffer 21. Row decoder 12 selects a row (word line) of memory cell array 10 in response to row address signals A1 to An from address buffer 11. Column decoder 13 selects a column (column selecting line, bit line) of memory cell array 10 in response to column address signals A1 to An from address buffer 11. Sense amplifier 14 amplifies the data signal read out of memory cell array 10. Input/output circuit 15 including a column selecting gate and a data input/output line pair inputs the data signal to a column selected by column decoder 13, and outputs the data signal from a column selected by a column decoder 13. Input buffer 16 supplies write driver 17 with data signal DQ input to data input/output terminal 29. Write driver 17 supplies data signal DQ to input/output circuit 15, and writes, in response to internal write enable signal int/WE from /WE buffer 22, data signal DQ to memory cells arranged in a row selected by row decoder 12 and in a column selected by column decoder 13.

This DRAM further includes an internal power supply circuit 30 and a test mode detecting circuit 31. Internal power supply circuit 30 generates internal power supply voltage intVCC (3.3V, for example) by lowering external power supply voltage extVCC from power supply terminal 23, and supplies it to internal circuits such as memory cell array 10, address buffer 11, row decoder 12, column decoder 13, and write driver 17.

Test mode detecting circuit 31 detects a test mode and generates a test mode signal TE when internal row address strobe signal int/RAS, internal column address strobe signal int/CAS and internal write enable signal int/WE are supplied at WCBR (/WE, /CAS before /RAS) timing and a prescribed address key is received. Supplying capability of internal power supply circuit 30 varies depending on test mode signal TE.

FIG. 2 is a circuit diagram showing a specific structure of internal power supply circuit 30 in FIG. 1. Referring to FIG. 2, internal power supply circuit 30 includes a voltage down converter (VDC) 300 connected to external power supply node 1 receiving external power supply voltage extVCC, and supplying internal power supply voltage intVCC to internal power supply node 2, and a driver transistor 303 connected to external power supply node 1 and supplying internal power supply voltage intVCC to internal power supply node 2. Internal power supply circuit 30 further includes a transfer gate 304, an inverter circuit 305, and a P channel MOS transistor 306, in order to activate/inactivate driver transistor 303 in response to test mode signal TE.

Voltage down converter 300 includes a differential amplifier 301 and a driver transistor 302. Differential amplifier 301 has an inverted input terminal receiving a reference voltage VREF and a non-inverted input terminal connected to internal power supply node 2. Driver transistor 302 is a P channel MOS transistor, has its gate connected to an output terminal of differential amplifier 301, and it is connected between external power supply node 1 and internal power supply node 2.

Driver transistor 303 is a P channel MOS transistor, has its gate connected to the output terminal of differential amplifier 301 via transfer gate 304, and it is connected between external power supply node 1 and internal power supply node 2. Transfer gate 304 is connected between the output terminal of differential amplifier 301 and a gate of driver transistor 303, and it is turned on/off in response to test mode signal TE. P channel MOS transistor 306 is connected between external power supply node 1 and the gate of driver transistor 303, and it turns off driver transistor 303 in response to test mode signal TE when transfer gate 304 is off.

Figure 3:
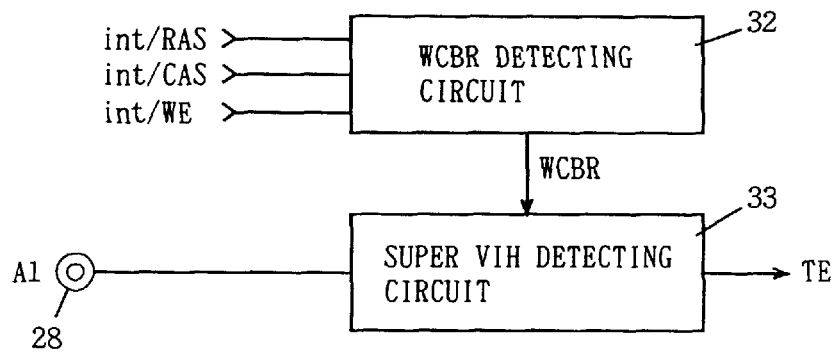
FIG. 3 is a block diagram showing a structure of a test mode detecting circuit in FIG. 1.

FIG. 3 is a block diagram showing a structure of test mode detecting circuit 31 in FIG. 1. Referring to FIG. 3, test mode detecting circuit 31 includes a WCBR detecting circuit 32 and a super VIH detecting circuit 33.

WCBR detecting circuit 32 generates a test mode signal WCBR when internal column address strobe signal int/CAS and internal write enable signal int/WE are activated before activation of internal row address strobe signal int/RAS, that is, when signals int/RAS, int/CAS, and int/WE are supplied at WCBR timing.

Super VIH detecting circuit 33 is connected to one address terminal 28, and it generates test mode signal TE when test mode signal WCBR is activated and voltage (super VIH) higher than internal power supply voltage intVCC is supplied to address terminal 28.

Figure 4:
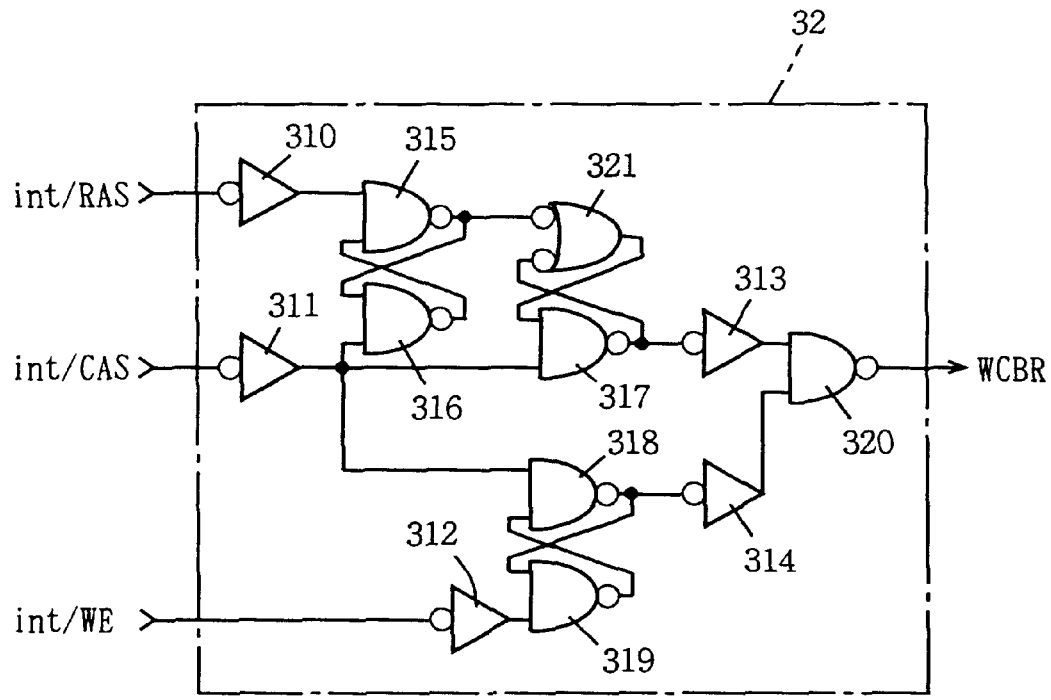
FIG. 4 is a circuit diagram showing a specific structure of a WCBR detecting circuit in FIG. 3.

FIG. 4 is a circuit diagram showing a specific structure of WCBR detecting circuit 32 in FIG. 3. Referring to FIG. 4, WCBR detecting circuit 32 includes inverter circuits 310 to 314, NAND circuits 315 to 320, and a negative logic NAND circuit 321.

Figure 5:
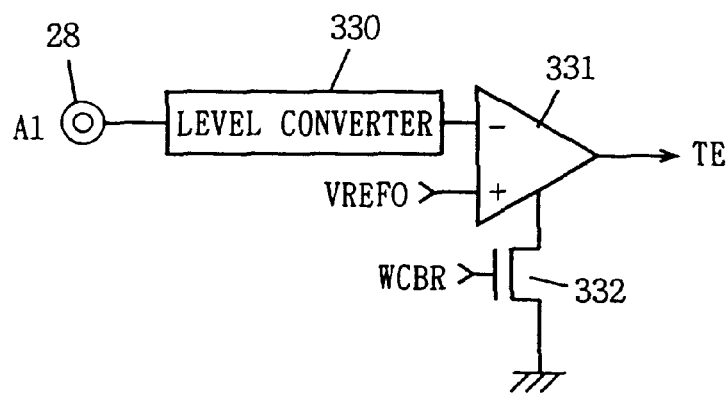
FIG. 5 is a block diagram showing a specific structure of a super VIH detecting circuit in FIG. 3.
Figure 6:
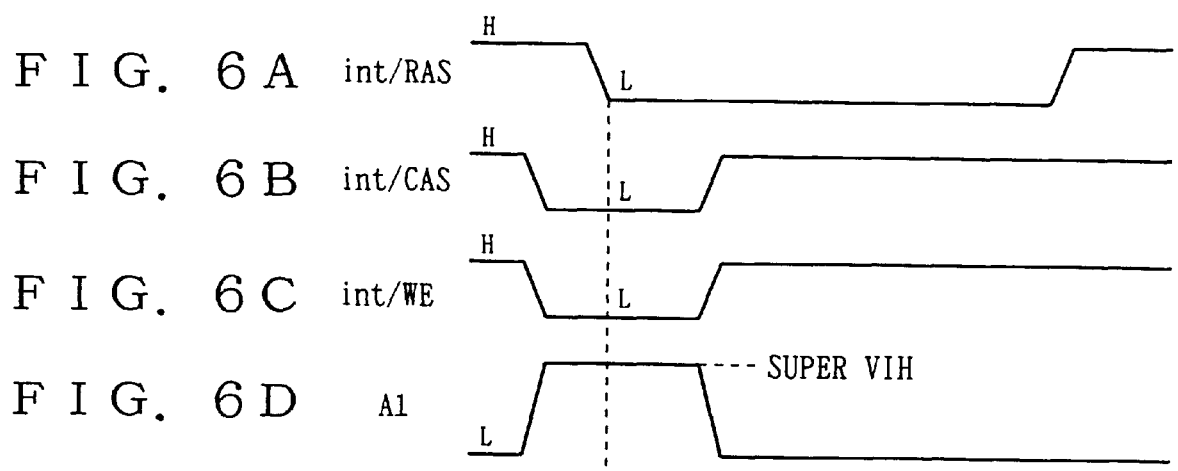
FIGS. 6A to 6D are timing charts showing operation of the test mode detecting circuit of FIG. 3.

FIG. 5 is a block diagram showing a specific structure of super VIH detecting circuit 33 in FIG. 3. Referring to FIG. 5, super VIH detecting circuit 33 includes a level converter 330 converting a level of the super VIH supplied to address terminal 28, a differential amplifier 331 generating test mode signal TE by comparing an output voltage of level converter 330 with a reference voltage VREF0, and an N channel MOS transistor 332 connected to a ground terminal of differential amplifier 331 and activating/inactivating differential amplifier 331 in response to test mode signal WCBR.

Next, operation of the DRAM constituted as above, especially that of internal power supply circuit 30 and test mode detecting circuit 31 will be described.

This DRAM has normal and test modes and performs a normal operation in the normal mode. Since test mode detecting circuit 31 generates L (logic low; inactive) level test mode signal TE in the normal mode, transfer gate 304 in FIG. 2 is turned on and P channel MOS transistor 306 is turned off. As a result, driver transistor 303 is connected parallel to driver transistor 302, so that the entire substantial gate width of driver transistors 302 and 303 becomes wider. Therefore, internal power supply circuit 30 has high current supplying ability in the normal mode.

If the DRAM is operated in the normal mode after fabrication of a DRAM chip structured as above, internal power supply circuit 30 may oscillate because of its high current supplying capability.

If internal power supply circuit 30 oscillates, external row address strobe signal ext/RAS, external column address strobe signal ext/CAS and external write enable signal ext/WE are supplied at the WCBR timing, and super VIH higher than internal power supply voltage intVCC is supplied to address terminal 28 as an address signal A1.

As shown in timing charts of FIGS. 6A to 6D, if internal column address strobe signal int/CAS and internal write enable signal int/WE are both activated to an L level before activation of internal row address strobe signal int/RAS to the L level, WCBR detecting circuit 32 in FIG. 3 generates H (logic high: active) level test mode signal WCBR. Therefore, super VIH detecting circuit 33 in FIG. 3 is activated in response to H level test mode signal WCBR. Since the super VIH is being supplied to address terminal 28 as address signal A1 at this time, super VIH detecting circuit 33 generates H level test mode signal TE.

When test mode signal TE is activated to an H level, transfer gate 304 in FIG. 2 is turned off and P channel MOS transistor 306 is turned on. Since driver transistor 303 is consequently disconnected from driver transistor 302, the entire substantial gate width of driver transistors 302 and 303 becomes narrower. Since P channel MOS transistor 306 is on, the gate of driver transistor 303 never attains the high impedance state. As a result, driver transistor 303 is almost perfectly off.

If oscillation in internal power supply circuit 30 is stopped by disconnecting driver transistor 303 as above, it becomes apparent that the gate width of driver transistor 302 is optimal.

According to the first embodiment, the substantial gate width of the driver transistor can be made narrower by receiving the WCBR and the address key without revising a mask even if internal power supply circuit 30 in a manufactured DRAM chip oscillates. Therefore, the optimal gate width of driver transistors can be evaluated not by simulation but on an actual chip without troublesome work such as the FIB process. As a result, the gate width of driver transistors can easily be optimized so that internal power supply circuit 30 does not oscillate and it has adequate current supplying capability.

Also, since the substantial gate width of the driver transistor can be made narrower by receiving the WCBR and the address key, increase in chip area is suppressed as compared to the bonding option or the like.

Second Embodiment

Figure 7:
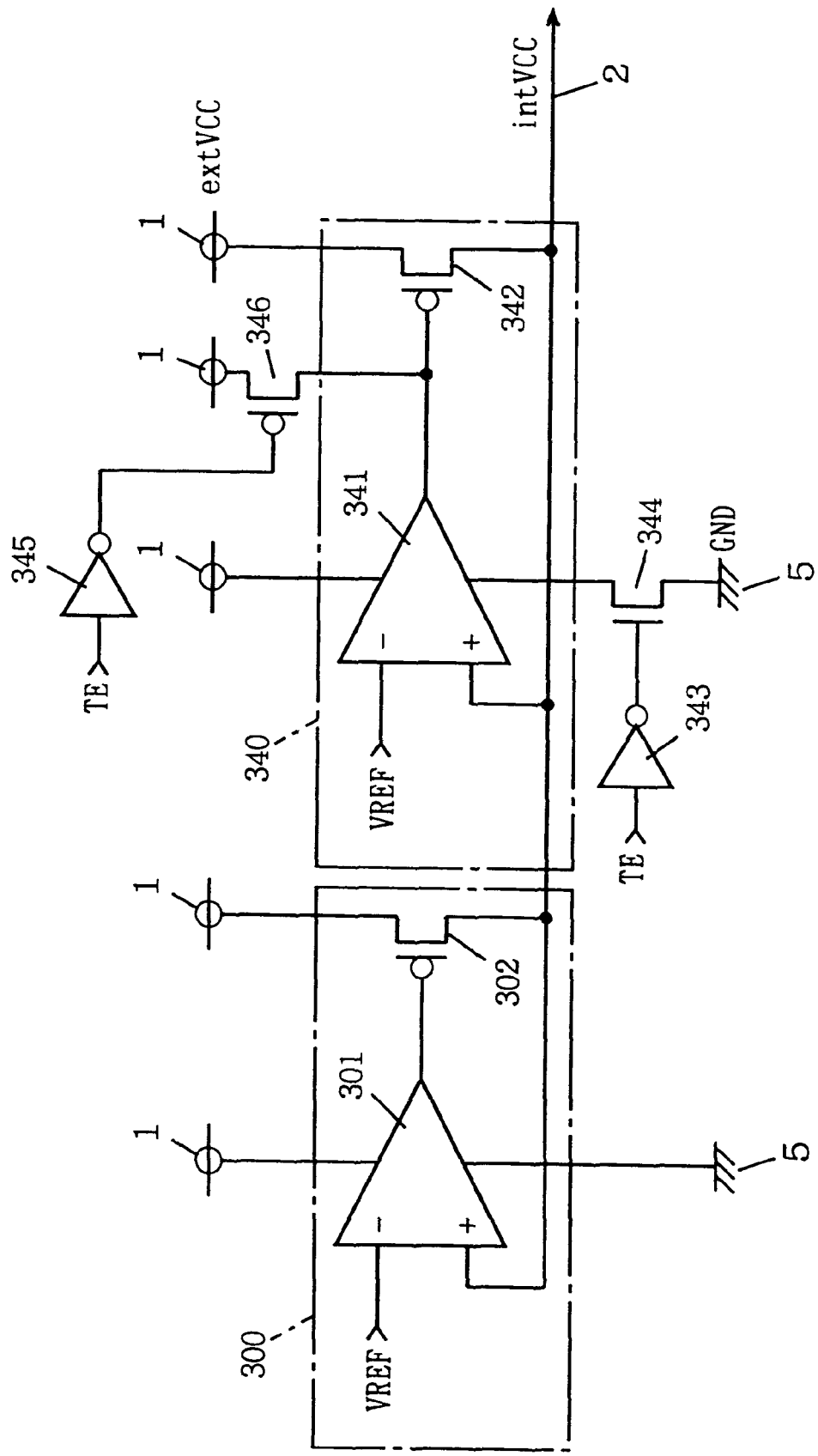
FIG. 7 is a circuit diagram showing a specific structure of an internal power supply circuit in a DRAM in accordance with a second embodiment of the present invention.

FIG. 7 is a circuit diagram showing a specific structure of an internal power supply circuit in a DRAM in accordance with the second embodiment of the present invention. Referring to FIG. 7, this internal power supply circuit includes a first voltage down converter 300 identical with voltage down converter 300 in FIG. 2, and a second voltage down converter 340 instead of driver transistor 303 in FIG. 2. Second voltage down converter 340 includes a differential amplifier 341 and a driver transistor 342. Differential amplifier 341 has an inverted input terminal receiving a reference voltage VREF and a non-inverted input terminal connected to an internal power supply node 2. Driver transistor 342 has its gate connected to an output terminal of differential amplifier 341, and it is connected between an external power supply node 1 and internal power supply node 2.

This internal power supply circuit further includes an inverter circuit 343, an N channel MOS transistor 344, an inverter circuit 345, and a P channel MOS transistor 346, in order to activate/inactivate voltage down converter 340 in response to a test mode signal TE. N channel MOS transistor 344 is connected to a power supply terminal (GND side) of differential amplifier 341, and it is turned on/off in response to test mode signal TE. P channel MOS transistor 346 is connected between external power supply node 1 and a gate of driver transistor 342, and it turns off driver transistor 342 in response to test mode signal TE when transistor 344 is off. Test mode signal TE is generated by test mode detecting circuit 31 shown in FIG. 3, as in the above described first embodiment.

When a DRAM having the above described internal power supply circuit is in a normal mode, test mode signal TE is inactivated to an L level. Since N channel MOS transistor 344 is on and P channel MOS transistor 346 is off, second voltage down converter 340 is activated. Therefore, both voltage down converters 300 and 340 supply an internal power supply voltage intVCC to internal power supply node 2.

When the internal power supply circuit oscillates in the normal mode, the DRAM assumes a test mode as in the first embodiment, and test mode signal TE is activated to an H level. Since N channel MOS transistor 344 and P channel MOS transistor 346 are consequently turned off and on, respectively, second voltage down converter 340 is inactive. In this case, P channel MOS transistor 346 supplies an external power supply voltage extVCC to the gate of driver transistor 342, so that driver transistor 342 is almost perfectly off.

According to the above described second embodiment, second voltage down converter 340 is inactivated by detection of the WCBR and the address key, thus the same results as in the first embodiment can be obtained.

Third Embodiment

Figure 8:
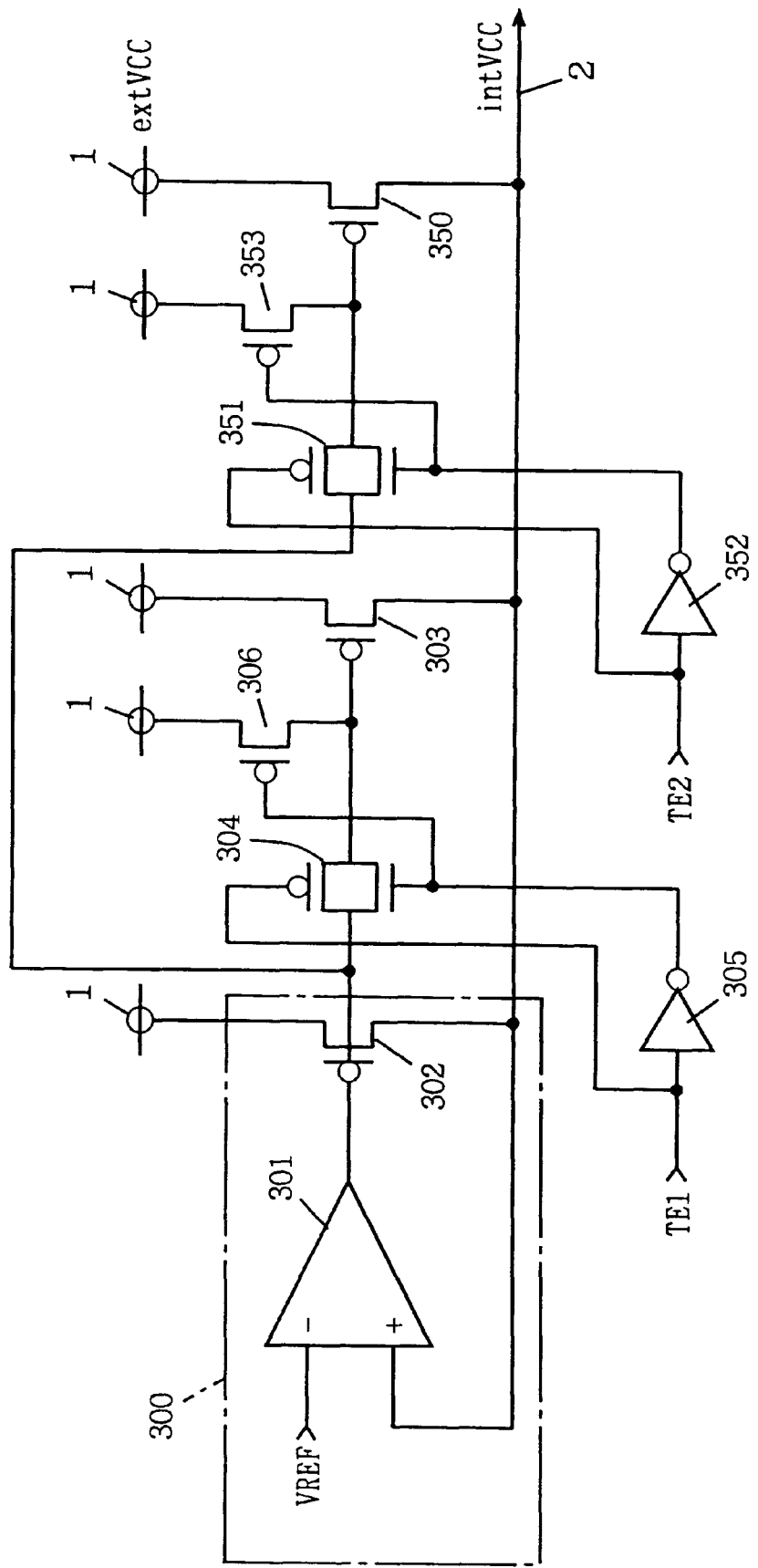
FIG. 8 is a circuit diagram showing a specific structure of an internal power supply circuit in a DRAM in accordance with a third embodiment of the present invention.

FIG. 8 is a circuit diagram showing a specific structure of an internal power supply circuit in a DRAM in accordance with the third embodiment of the present invention. Referring to FIG. 8, this internal power supply circuit includes, in addition to the structure of FIG. 2, a driver transistor 350 connected to an external power supply node 1 and supplying an internal power supply voltage intVCC to an internal power supply node 2. This internal power supply circuit further includes a transfer gate 351, an inverter circuit 352, and a P channel MOS transistor 353, in order to activate/inactivate driver transistor 350 in response to a test mode signal TE2 described below. Here, a transfer gate 304 and an inverter circuit 305 receive a test mode signal TE1 described below instead of test mode signal TE in FIG. 2.

In short, this internal power supply circuit includes, in addition to a voltage down converter 300, two driver transistors 303 and 350, and two circuits (304 to 306 and 351 to 353) for respectively inactivating these transistors.

Figure 9:
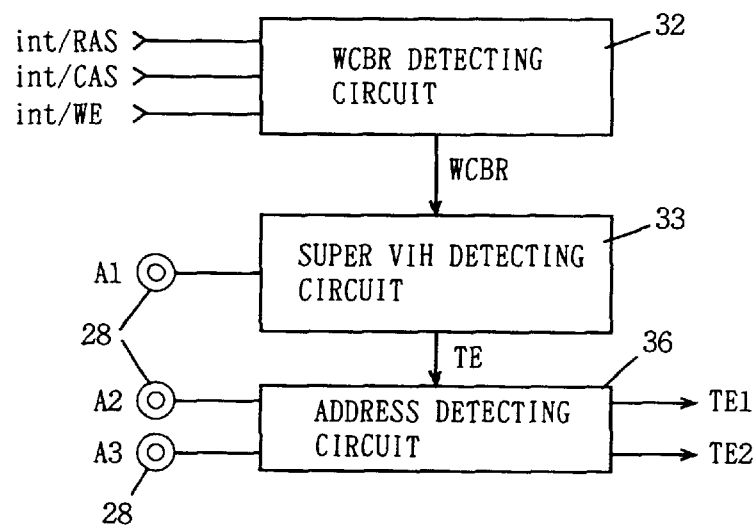
FIG. 9 is a block diagram showing a structure of a test mode detecting circuit used for the internal power supply circuit of FIG. 8.

FIG. 9 is a block diagram showing a structure of a test mode detecting circuit for the internal power supply circuit of FIG. 8. This test mode detecting circuit is used instead of test mode detecting circuit 31 in the above described first embodiment. Referring to FIG. 9, this test mode detecting circuit includes a WCBR detecting circuit 32 and a super VIH detecting circuit 33 as in the first embodiment, and further includes an address detecting circuit 36.

Address detecting circuit 36 is activated in response to test mode signal TE from super VIH detecting circuit 33, and it generates test mode signals TE1 and TE2 according to combination of address signals A2 and A3.

Figure 10:
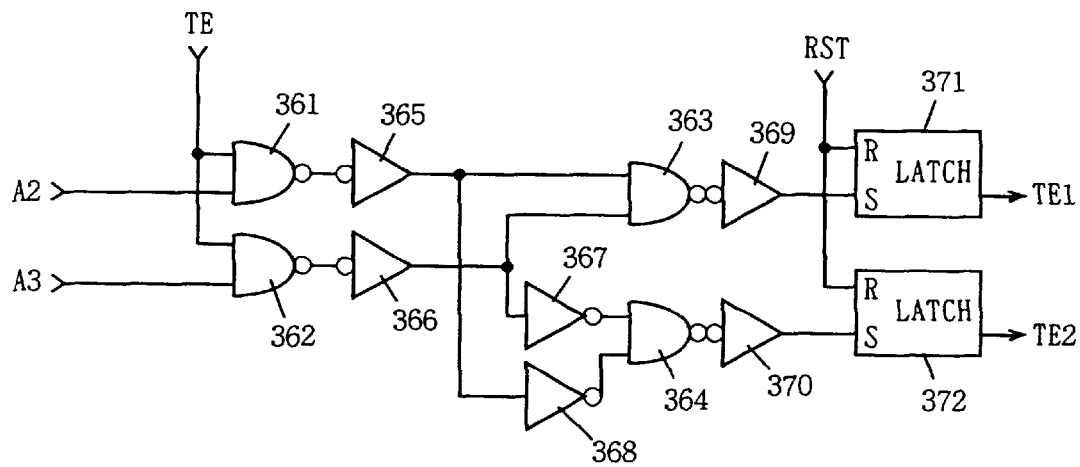
FIG. 10 is a circuit diagram showing a specific structure of an address detecting circuit in FIG. 9.

FIG. 10 is a circuit diagram showing a specific structure of address detecting circuit 36 in FIG. 9. Referring to FIG. 10, address detecting circuit 36 includes NAND circuits 361 to 364, inverter circuits 365 to 370, and latch circuits (RS flip-flop circuits) 371 and 372. NAND circuits 361 and 362 receive address signals A2 and A3, respectively, and both receive test mode signal TE. Latch circuits 371 and 372 generate test mode signals TE1 and TE2, respectively, and they are reset in response to a reset signal RST.

As shown in timing charts of FIGS. 11A to 11F, when the WCBR and the super VIH are detected, test mode signal TE is activated to the H level as in the first embodiment. H or L level address signal A2 can be input to address terminal 28, and H or L level address signal A3 can be independently input to address terminal 28. H or L level test mode signals TE1 and TE2 are generated according to combination of such address signals A2 and A3.

When the above described DRAM is in the normal mode, test mode signals TE1 and TE2 are both inactivated to the L level, so that driver transistors 303 and 350 are connected parallel to driver transistor 302.

When the above internal power supply circuit oscillates in the normal mode, at least one of test mode signals TE1 and TE2 is activated to the H level. Activation of test mode signal TE1 disconnects driver transistor 303. Activation of test mode signal TE2 disconnects driver transistor 350. Activation of both test mode signals TE1 and TE2 disconnects both driver transistors 303 and 350. Therefore, even if the internal power supply circuit oscillates after fabrication of the DRAM chip, the gate width of the driver transistor which does not oscillate and can supply enough current can be evaluated on an actual chip.

According to the above described third embodiment, a plurality of driver transistors 303, 350 are selectively inactivated by receiving the WCBR and the address key, so that the gate width of the driver transistors are optimized more precisely than in the first embodiment above.

As in the third embodiment above, the internal power supply circuit may include a plurality of driver transistors which can be selectively inactivated. Similarly, the internal power supply circuit may include a plurality of voltage down converters which can be selectively inactivated. Also, a plurality of driver transistors or voltage down converters may be selectively activated with activation of the test enable signal.

Fourth Embodiment

FIG. 12 is a circuit diagram showing a specific structure of an internal power supply circuit in a DRAM in accordance with the fourth embodiment of the present invention. Referring to FIG. 12, this internal power supply circuit includes, in addition to the structure of FIG. 2, a fuse 380 connected to a driver transistor 303 in series.

Here, a transfer gate 304, an inverter circuit 305 and a P channel MOS transistor 306 temporarily inactivate driver transistor 303 in response to a test mode signal TE. Fuse 380 is of polysilicon, for example, and it normally inactivates driver transistor 303. Although test mode signal TE is desirably generated in response to detection of the WCBR and the address key as in the first embodiment above, it may be generated, for example, by so-called bonding option.

Since test mode signal TE is inactive when the DRAM having the internal power supply circuit above is in the normal mode, driver transistor 303 is connected parallel to a driver transistor 302. Here, fuse 380 is not blown off.

If this internal power supply circuit oscillates fabrication of a DRAM chip, test mode signal TE is activated, so that driver transistor 303 is temporarily disconnected from driver transistor 302.

However, if oscillation is caused irrelevantly to the substantial gate width of the driver transistor, disconnection of driver transistor 303 does not stop oscillation. In this case, driver transistor 303 is again connected parallel to driver transistor 302.

On the other hand, if oscillation is caused relevantly to the substantial gate width of the driver transistor, disconnection of driver transistor 303 stops oscillation. In this case, fuse 380 is physically blown off by laser trimming, for example. Driver transistor 303 is consequently disconnected from driver transistor 302 permanently. Therefore, the gate width of the driver transistor is optimized so that oscillation is not caused and enough current can be supplied. As a result, a DRAM having an optimally tuned internal power supply circuit can be provided.

According to the fourth embodiment above, since fuse 380 permanently inactivating driver transistor 303 is provided in addition to a circuit (304 to 306) for temporarily inactivating driver transistor 303, the substantial gate width of the driver transistor can be permanently made narrower by blowing off fuse 380, after an optimal gate width is evaluated by temporarily narrowing the substantial gate width of a driver transistors in the internal power supply circuit during mass production of a DRAM chip. As a result, a DRAM having an optimized gate width of a driver transistor in the internal power circuit is provided.

Fifth Embodiment

Figure 13:
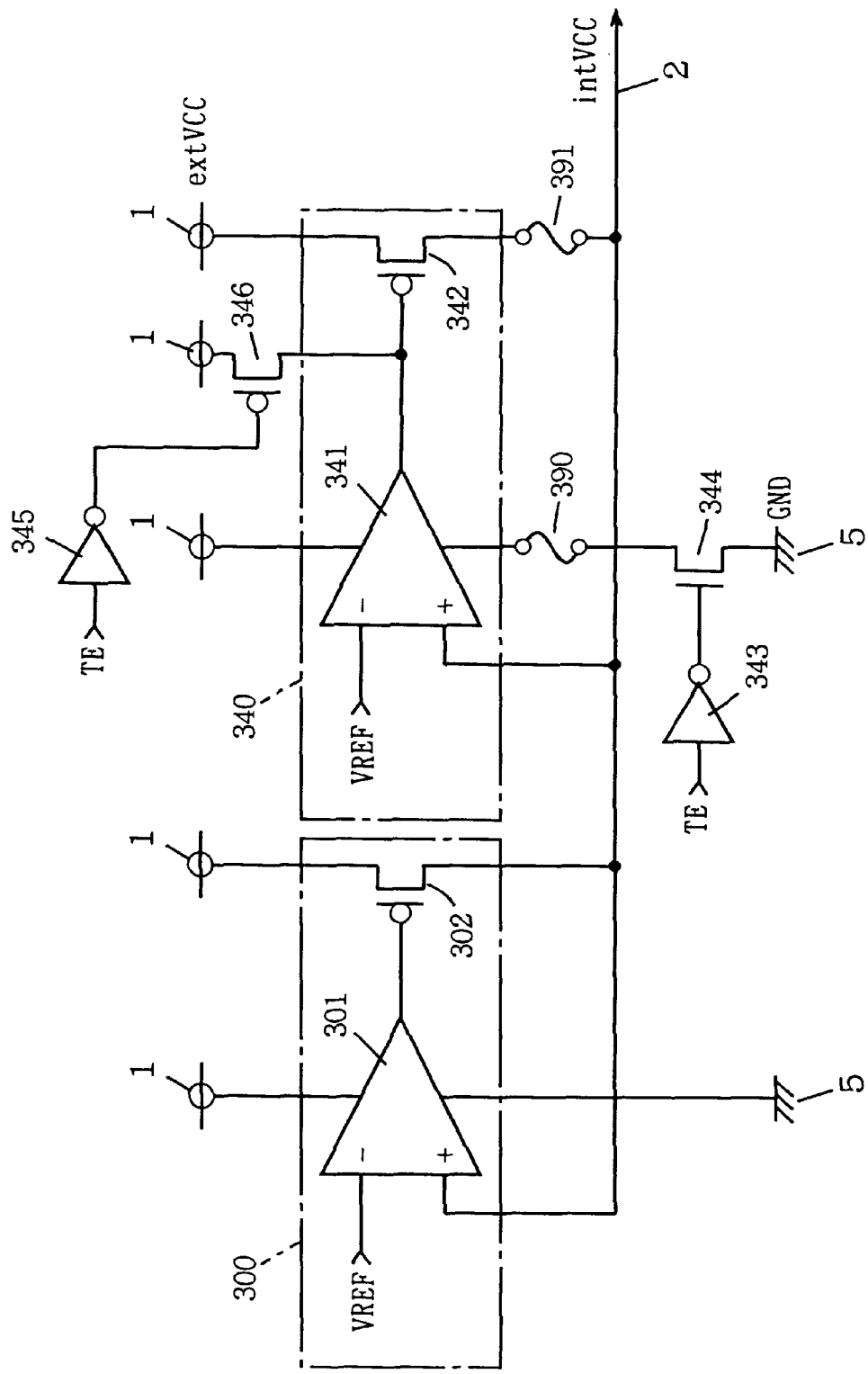
FIG. 13 is a circuit diagram showing a specific structure of an internal power supply circuit of a DRAM in accordance with a fifth embodiment of the present invention.
Figure 14:
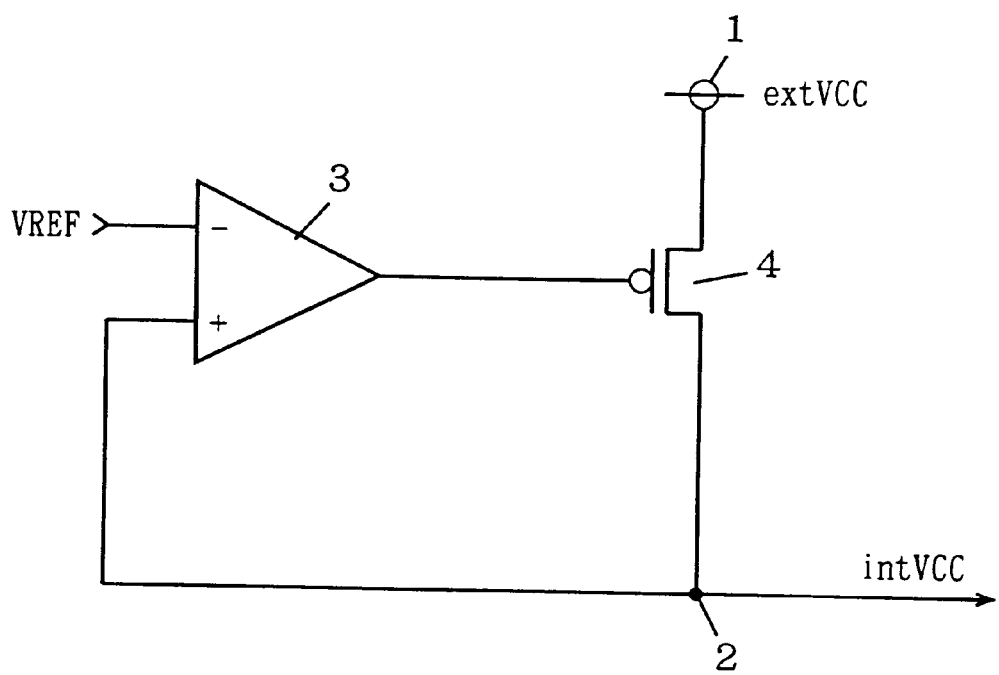
FIG. 14 is a circuit diagram showing a structure of a conventional internal power supply circuit in a DRAM.
Figure 15:
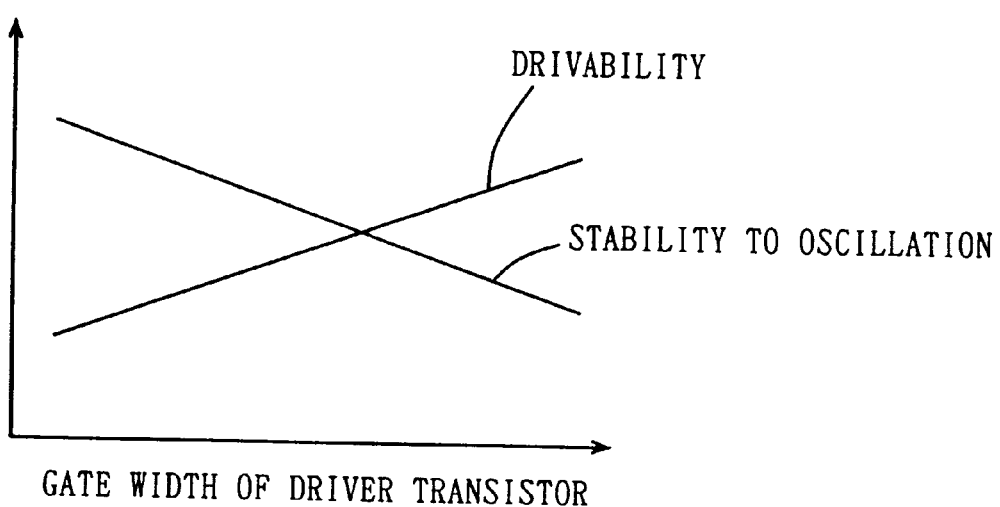
FIG. 15 is a graph showing the relationship between each of a gate width, drivability and stability to oscillation of a driver transistor in FIG. 14.

FIG. 13 is a circuit diagram showing a specific structure of an internal power supply circuit in a DRAM in accordance with the fifth embodiment of the present invention. Referring to FIG. 13, this internal power supply circuit includes, in addition to the structure of FIG. 7, fuses 390 and 391 of, for example, polysilicon, to normally inactivate driver transistor 342. Fuse 390 is connected in series with N channel MOS transistor 344. Fuse 391 is connected in series with driver transistor 342.

Since a test mode signal TE is inactive when the DRAM having the internal power supply circuit structured as above is in a normal mode, a second voltage down converter 340 is activated. Here, fuses 390 and 391 are not blown off.

If this internal power supply circuit oscillates after fabrication of a DRAM chip, test mode signal TE is activated. Since second voltage down converter 340 is consequently inactivated, the substantial gate width of driver transistors in this internal power supply circuit becomes narrower. If this stops oscillation, fuses 390 and 391 are physically blown off, thus second voltage down converter 340 is permanently inactive. Therefore, a DRAM having an optimized substantial gate width of the driver transistors in an internal power supply circuit is provided.

The fifth embodiment above can provide the same results as the fourth embodiment.

Although the internal power supply circuit in the fourth embodiment includes one driver transistor 303 which can be selectively inactivated, and the internal power supply circuit in the fifth embodiment includes one voltage down converter 340 which can be selectively inactivated, the internal power supply circuit may include a plurality of driver transistors or voltage down converters which can be selectively inactivated, as in the third embodiment.

Also, instead of fuses 390, 391 blown off by laser, a fuse may be used, which conducts when a gate oxide film is broken due to application of high voltage. Further, a fuse including a reversible nonvolatile memory may be used instead of a non-reversible fuse above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device receiving an external power supply voltage and having normal and test modes, comprising:

an internal circuitry connected to an internal power supply node and performing prescribed operation;

first internal power supply means connected to an external power supply node receiving said external power supply voltage for supplying said internal power supply node with an internal power supply voltage lower than said external power supply voltage;

second internal power supply means connected to said external power supply node for supplying said internal power supply node with said internal power supply voltage;

detecting means responsive to control signals externally supplied at predetermined timing for detecting said test mode and generating a first test mode signal; and activating/inactivating means responsive to said first test mode signal for activating/inactivating said second internal power supply means.

2. The semiconductor circuit device according to claim 1, further comprising:

a plurality of address terminals receiving row and column address signals; wherein said internal circuitry includes a memory cell array having a plurality of memory cells arranged in rows and columns, an address buffer receiving said row address signal in response to a row address strobe signal, and receiving said column address signal in response to a column address strobe signal, a row decoder selecting a row of said memory cell array in response to said row address signal from said address buffer, a column decoder selecting a column of said memory cell array in response to said column address signal from said address buffer, and writing means responsive to a write enable signal for writing a data signal to a memory cell arranged in a row selected by said row decoder and in a column selected by said column decoder;

said detecting means includes
means for generating a second test mode signal when said column address strobe signal and said write enable signal are activated before activation of said row address strobe signal, and
means connected to at least one of said address terminals for generating said first test mode signal when said second test mode signal is activated and a voltage higher than said internal power supply voltage is supplied to said at least one of said address terminals.

3. The semiconductor circuit device according to claim 1, wherein
said first internal power supply means includes
a differential amplifier having an inverted input terminal receiving a reference voltage and a non-inverted input terminal connected to said internal power supply node, and
a first driver transistor having its gate connected to an output terminal of said differential amplifier, and connected between said external power supply node and said internal power supply node;
said second internal power supply means includes a second driver transistor having its gate connected to the output terminal of said differential amplifier, and connected between said external power supply node and said internal power supply node.

4. The semiconductor circuit device according to claim 3, wherein
said activating/inactivating means includes
switching means connected between the output terminal of said differential amplifier and the gate of said second driver transistor and being turned on/off in response to said first test mode signal, and
means responsive to said first test mode signal for turning off said second driver transistor when said switching means is turned off.

5. The semiconductor circuit device according to claim 1, wherein
said first internal power supply means includes
a first differential amplifier having an inverted input terminal receiving a first reference voltage and a non-inverted input terminal connected to said internal power supply node, and
a first driver transistor having its gate connected to an output terminal of said first differential amplifier, and connected between said external power supply node and said internal power supply node;
said second internal power supply means includes
a second differential amplifier having an inverted input terminal receiving a second reference voltage and a non-inverted input terminal connected to said internal power supply node, and
a second driver transistor having its gate connected to an output terminal of said second differential amplifier, and connected between said external power supply node and said internal power supply node.

6. The semiconductor circuit device according to claim 5, wherein
said activating/inactivating means includes
switching means connected to a power supply terminal of said second differential amplifier and being turned on/off in response to said first test mode signal, and
means responsive to said first test mode signal for turning off said second driver transistor when said switching means is turned off.

7. A semiconductor circuit device receiving an external power supply voltage and having normal and test modes, comprising:
an internal circuitry connected to an internal power supply node and performing prescribed operation;
first internal power supply means connected to an external power supply node receiving said external power supply voltage for supplying said internal power supply node with an internal power supply voltage lower than said external power supply voltage;
second internal power supply means connected to said external power supply node for supplying said internal power supply node with said internal power supply voltage;
detecting means detecting said test mode and generating a test mode signal;
first inactivating means responsive to said test mode signal for temporarily inactivating said second internal power supply means; and
second inactivating means normally inactivating said second internal power supply means.

8. The semiconductor circuit device according to claim 7, wherein
said first internal power supply means includes
a differential amplifier having an inverted input terminal receiving a reference voltage and a non-inverted input terminal connected to said internal power supply node, and
a first driver transistor having its gate connected to an output terminal of said differential amplifier, and connected between said external power supply node and said internal power supply node;
said second internal poser supply means includes a second driver transistor having its gate connected to the output terminal of said differential amplifier, and connected between said external power supply node and said internal power supply node.

9. The semiconductor circuit device according to claim 8, wherein
said first inactivating means includes
switching means connected between the output terminal of said differential amplifier and the gate of said second driver transistor and being turned off in response to said test mode signal, and
means responsive to said test mode signal for turning off said second driver transistor.

10. The semiconductor circuit device according to claim 8, wherein
said second inactivating means includes a fuse connected in series with said second driver transistor.

11. The semiconductor circuit device according to claim 7, wherein
said first internal power supply means includes
a first differential amplifier having an inverted input terminal receiving a first reference voltage and a non-inverted input terminal connected to said internal power supply node, and
a first driver transistor having its gate connected to an output terminal of said first differential amplifier, and connected between said external power supply node and said internal power supply node;
said second internal power supply means includes
a second differential amplifier having an inverted input terminal receiving a second reference voltage and a non-inverted input terminal connected to said internal power supply node, and a second driver transistor having its gate connected to an output terminal of said second differential amplifier, and connected between said external power supply node and said internal power supply node.

12. The semiconductor circuit device according to claim 11, wherein
said first inactivating means includes
switching means connected to a power supply terminal of said second differential amplifier and being turned off in response to said test mode signal, and
means responsive to said test mode signal for turning off said second driver transistor.

13. The semiconductor circuit device according to claim 12, wherein
said second inactivating means includes
a first fuse connected in series with said switching means, and
a second fuse connected in series with said second driver transistor.

* * * * *